United States Patent
Joo

(10) Patent No.: US 10,049,718 B2
(45) Date of Patent: Aug. 14, 2018

(54) REFRESH CONTROL CIRCUIT AND MEMORY DEVICE INCLUDING SAME

(71) Applicant: SK hynix Inc., Gyeonggi-do (KR)

(72) Inventor: No-Guen Joo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/804,438

(22) Filed: Nov. 6, 2017

(65) Prior Publication Data

US 2018/0061485 A1 Mar. 1, 2018

Related U.S. Application Data

(62) Division of application No. 15/093,418, filed on Apr. 7, 2016, now Pat. No. 9,842,640.

(30) Foreign Application Priority Data

Nov. 18, 2015 (KR) ........................ 10-2015-0161690

(51) Int. Cl.
*G11C 11/00* (2006.01)
*G11C 11/406* (2006.01)

(52) U.S. Cl.
CPC ...... *G11C 11/40618* (2013.01); *G11C 11/406* (2013.01); *G11C 11/40603* (2013.01)

(58) Field of Classification Search
CPC ............ G11C 11/40618; G11C 11/406; G11C 11/40603

USPC ............................ 365/222, 191, 195, 230.03
See application file for complete search history.

(56) References Cited

U.S. PATENT DOCUMENTS

| | | | |
|---|---|---|---|
| 6,603,694 B1 * | 8/2003 | Frankowsky | G11C 11/406 365/222 |
| 9,165,637 B2 * | 10/2015 | Kim | G11C 11/40622 |
| 9,349,431 B1 * | 5/2016 | Saifuddin | G11C 11/40611 |
| 2017/0263305 A1 * | 9/2017 | Cho | G11C 11/406 |

OTHER PUBLICATIONS

D. H. Kim, P. J. Nair and M. K. Qureshi, "Architectural Support for Mitigating Row Hammering in DRAM Memories," in IEEE Computer Architecture Letters, vol. 14, No. 1, pp. 9-12, Jan.-Jun. 1, 2015. doi: 10.1109/LCA.2014.2332177 URL: http://ieeexplore.ieee.org/stamp/stamp.jsp?tp=&arnumber=6840960&isnumber=7128787.*

* cited by examiner

*Primary Examiner* — Tan T Nguyen
(74) *Attorney, Agent, or Firm* — IP & T Group LLP

(57) ABSTRACT

A memory device may include: at least one memory bank; and a control circuit suitable for: refreshing the at least one memory bank through a first refresh operation in response to a refresh command; and refreshing the at least one memory bank through a second refresh operation when an active operation is performed between a current refresh command and a previous refresh command.

9 Claims, 7 Drawing Sheets

REFRESH CONTROL CIRCUIT AND MEMORY DEVICE INCLUDING SAME

CROSS-REFERENCE TO RELATED APPLICATIONS

This application is a division of U.S. patent application Ser. No. 15/093,418 filed on Apr. 7, 2016, which claims priority of Korean Patent Application No. 10-2015-0161690, filed on Nov. 18, 2015. The disclosure of each of the foregoing application is incorporated herein by reference in its entirety.

BACKGROUND

1. Field

The present application relates to a refresh control circuit and to a memory device including the refresh control circuit.

2. Description of the Related Art

A memory cell of a memory device includes a transistor serving as a switch and a capacitor for storing data in the form of an electrical charge (data). According to whether an electrical charge is stored in the memory cell or a voltage across the capacitor is high or low, the data may be categorized into high (logic 1) and low (logic 0).

Since the data is stored in such a manner that electrical charges are accumulated, no power is consumed in principle. However, the initial charge stored in the capacitor may be degraded due to a leakage current caused by a PN junction of a MOS transistor, and, thus, the data may be lost. In order to prevent such a data loss, the data of the memory cell must be read, and the memory cell must be recharged according to the read information, before the data is lost. Such an operation must be periodically repeated to retain the data.

The operation of recharging the memory cell is commonly referred to as a refresh operation.

FIG. 1 is a diagram illustrating a part of a cell array of a memory device, for explaining a row hammer effect.

Referring to FIG. 1, 'BL' and 'BL+1' represent bit lines, and 'WLK−1', 'WLK', and 'WLK+1' in the cell array represent three word lines arranged in parallel to each other. In particular, 'WLK' with 'HIGH_ACT' corresponds to a word line of which the active count or active frequency is high. 'WLK−1' and 'WLK+1' are word lines arranged adjacent to the word line WLK. Furthermore, 'CELL_K−1', 'CELL_K', and 'CELL_K+1' represent memory cells coupled to the word lines WLK−1, WLK, and WLK+1, respectively. The memory cells CELL_K−1, CELL_K, and CELL_K+1 include cell transistors TR_K−1, TR_K, and TR_K+1 and cell capacitors CAP_K−1, CAP_K, and CAP_K+1, respectively.

When the word line WLK is activated and precharged (deactivated), the voltages of the word lines WLK−1 and WLK+1 rise or fall due to couplings between the word line WLK and the word lines WLK−1 and WLK+1, thereby having an influence on the charges stored in the cell capacitors CAP_K−1 and CAP_K+1. Thus, when the word line WLK is frequently activated and or precharged to toggle between the active state and the precharge state, the charges stored in the capacitors CAP_K−1 and CAP_K+1 may be changed to damage the data stored in the cell capacitors CELL_K−1 and CELL_K+1.

Furthermore, electromagnetic waves generated while the word line WLK toggles between the active state and the precharge state may introduce/discharge electrons into/from the cell capacitors CAP_K+1 and CAP_K+1 included in the memory cells CELL_K−1 and CELL_K+1 coupled to the adjacent word lines WLK−1 and WLK+1, thereby damaging the data of the memory cells. This phenomenon is known in the art as row hammer. Row hammer increases as the memory cell density increases and therefore it is highly desirable to find ways to combat it.

SUMMARY

Various embodiments of the present invention are directed to a memory device configured to prevent the deterioration of data stored in a memory cell which may occur due to row hammer.

In an embodiment, a memory device may include: at least one memory bank; and a control circuit suitable for: refreshing the at least one memory bank through a first refresh operation in response to a refresh command; and refreshing the at least one memory bank through a second refresh operation when an active operation is performed between a current refresh command and a previous refresh command.

In an embodiment, a memory device may include: a plurality of memory banks; a refresh counter suitable for generating a refresh address; a plurality of address storage units suitable for storing an address of a word line of a corresponding memory bank among the plurality of memory banks; and a control circuit suitable for refreshing a word line corresponding to the refresh address in the plurality of memory banks through a first refresh operation in response to a refresh command, and refreshing a word line adjacent to a word line corresponding to the address stored in a corresponding address storage unit in a memory bank on which an active operation is performed between a current refresh command and a previous refresh command, among the plurality of memory banks, through a second refresh operation.

In an embodiment, a memory device may include: a plurality of memory banks; and a plurality of address storage units suitable for storing an address corresponding to a word line of a corresponding memory bank among the plurality of memory banks; and a control circuit suitable for refreshing the plurality of memory banks through a first refresh operation in response to a refresh command, and refreshing a memory bank, which is not refreshed through a second refresh operation after an address is stored in a corresponding address storage unit among the plurality of address storage units, through the second refresh operation.

In an embodiment, a refresh control circuit may include: a pre-refresh active signal generator suitable for activating a plurality of pre-refresh active signals one or more times during a refresh period; and a refresh active signal generator suitable for transmitting the plurality of pre-refresh active signals as a plurality of refresh active signals, respectively, and blocking a pre-refresh active signal of which a corresponding active control signal is not activated between a current refresh command and a previous refresh command.

The refresh control circuit may further include: a pulse signal generator suitable for generating a refresh end pulse which is activated at a point of time that the refresh period is ended.

The refresh active signal generator may include a plurality of signal generation units.

Each of the signal generation units may include: a latch suitable for latching a voltage of an internal node; and a driving unit suitable for driving the voltage of the internal node to a first level when the corresponding active control signal is activated at periods except for the refresh period, and driving the voltage of the internal node to a second level in response to the refresh end pulse.

Each of the signal generation units may further include: a signal transmission unit suitable for transmitting the corresponding pre-refresh active signal among the plurality of pre-refresh active signals as the corresponding refresh active signal among the plurality of refresh active signals, and blocking the corresponding pre-refresh active signal when the voltage of the internal node is at the second level during a target refresh operation.

In an embodiment, a memory device may include: a plurality of memory banks; and a control circuit suitable for refreshing the plurality of memory banks through a first refresh operation in response to a refresh command, and refreshing only a memory bank on which an active operation is performed between a current refresh command and a previous refresh command, among the plurality of memory bank, through a second refresh operation.

The control circuit may control the memory banks except for the memory bank on which an active operation is performed between the current refresh command and the previous refresh command, among the plurality of memory banks, to skip the second refresh operation.

The first refresh operation may include a normal refresh operation for sequentially refreshing a plurality of word lines of the plurality of memory banks, and the second refresh operation comprises a target refresh operation for refreshing a word line adjacent to a word line which is activated at a given time point, among the plurality of word lines of the plurality of memory banks.

DETAILED DESCRIPTION

Figure 1:
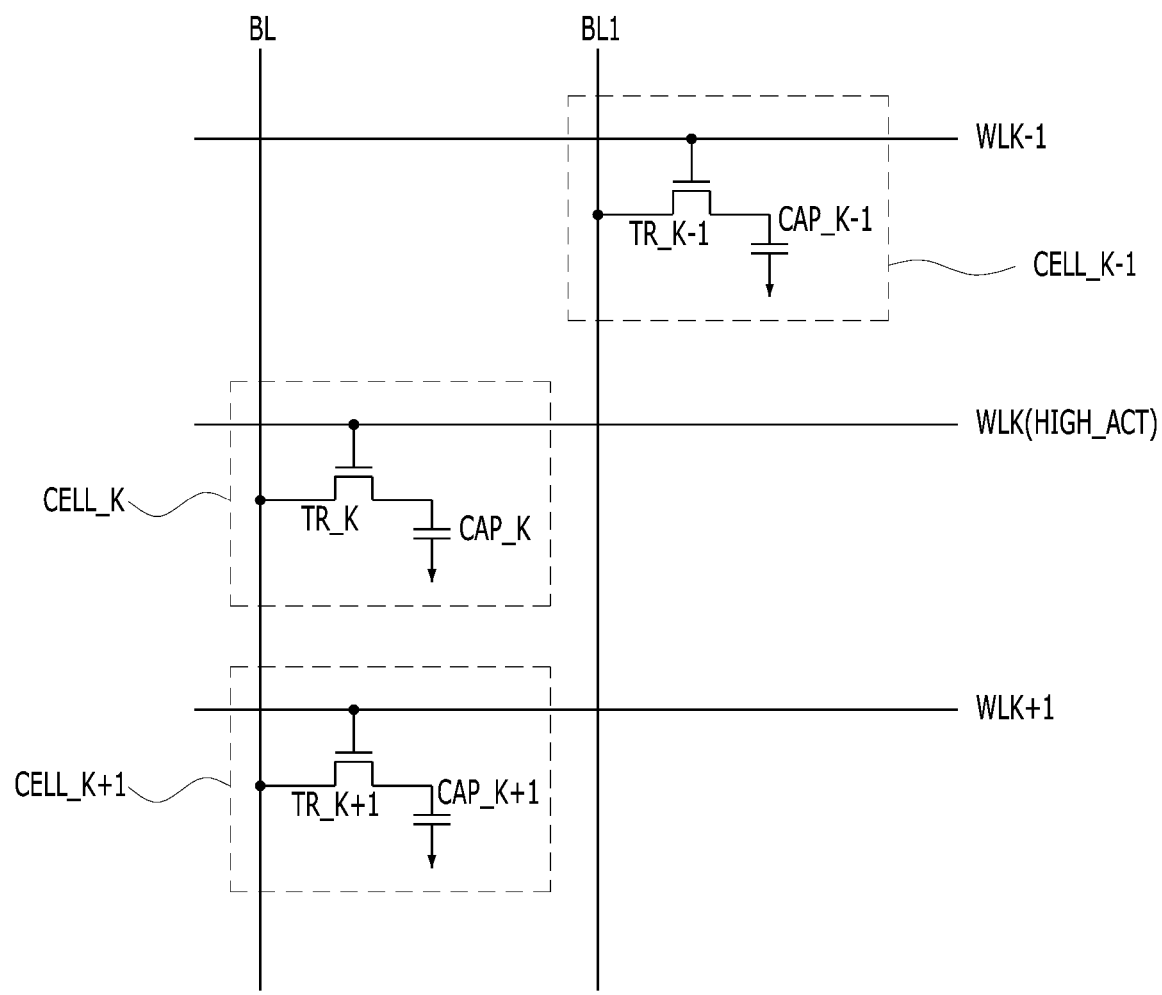
FIG. 1 is a diagram illustrating a part of a cell array of a memory device, for explaining a row hammer effect.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. In addition, it will also be understood that when an element or layer is referred to as being "between" two elements or layers, it can be the only element or layer between the two elements or layers, or one or more intervening elements or layers may also be present.

It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof.

The terminology used herein is for the purpose of describing particular embodiments only and is not intended to be limiting of the present disclosure. Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to the drawings.

Figure 2:
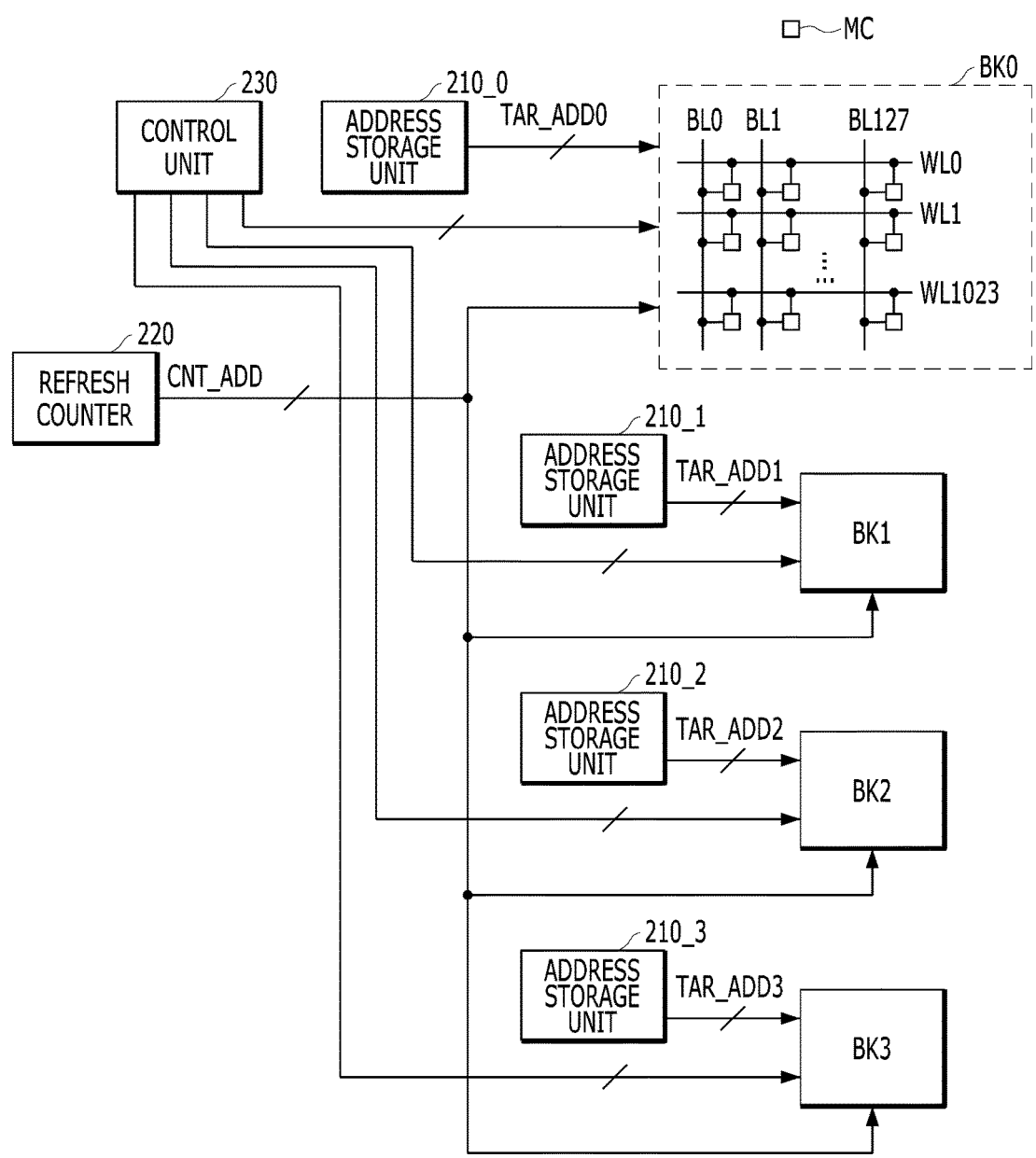
FIG. 2 is a diagram illustrating a part of the configuration of a memory device.

FIG. 2 is a diagram illustrating a part of the configuration of a memory device.

Referring to FIG. 2, the memory device may include a plurality of memory banks BK0 to BK3, a plurality of address storage units 210_0 to 210_3, a refresh counter 220, and a control unit 230.

Each of the memory banks BK0 to BK3 may include a plurality of word lines WL0 to WL1023, a plurality of bit lines BL0 to BL127, and a plurality of memory cells MC coupled between the word lines WL0 to WL1023 and the bit lines BL0 to BL127. The number of word lines, bit lines, and memory cells may be changed depending on design. FIG. 2 does not illustrate the internal configurations of the memory banks BK1 to BK3, but simply illustrates the memory banks BK1 to BK3. The plurality of memory banks BK0 to BK3 may be controlled by the control unit 230.

Each of the address storage units 210_0 to 210_3 may correspond to each of the memory banks BK0 to BK3, respectively. The address storage units 210_0 to 210_3 may store an address of a word line activated in the corresponding memory bank, during an active operation of the memory bank. The address storage units 210_0 to 210_3 may generate respective target addresses TAR_ADD0 to TAR_ADD3 using the addresses stored therein. The refresh counter 220 may generate a counting address CNT_ADD. Any suitable refresh counter may be used.

The control unit 230 may control the memory banks BK0 to BK3. For example, the control unit 230 may control the memory banks BK0 to BK3 to perform an operation, such as an active, refresh, read, or write operation in response to a command and address (not shown). Any suitable control unit may be used.

Figure 3:
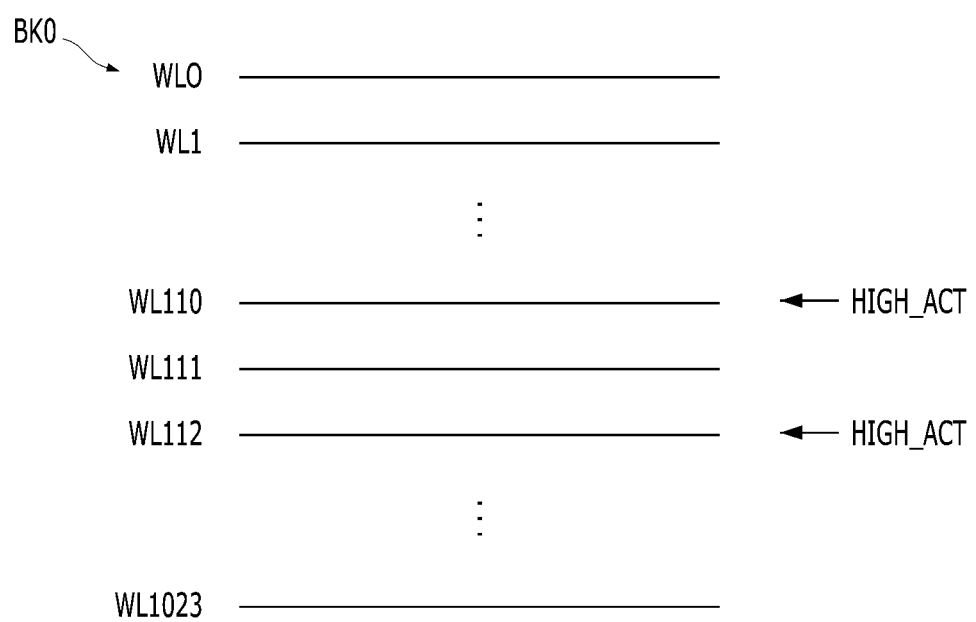
FIG. 3 is a diagram illustrating a target refresh operation of a memory bank of the memory device of FIG. 2.

FIG. 3 is a diagram illustrating a target refresh operation of the memory bank BK0 of the memory device of FIG. 2.

A normal refresh operation may indicate an operation of sequentially refreshing the plurality of word lines WL0 to WL1023 included in the memory banks BK0 to BK3. A word line which is to perform the normal refresh operation may be selected by the counting address CNT_ADD.

The target refresh operation may include additionally refreshing word lines corresponding to the target addresses TAR_ADD0 to TAR_ADD3, in addition to the normal refresh operation. The target addresses TAR_ADD0 to TAR_ADD3 may indicate addresses for selecting word lines which are adjacent to the word line corresponding to the address stored in the address storage units 210_0 to 210_3. For example, when the word line corresponding to the address stored in the address storage unit 210_0 is the word line WL111, the target refresh operation will include refreshing the word lines WL110 and WL112 which are adjacent to the word line WL111.

Hereafter, the case in which the address of the word line WL111 of the memory bank BK0 is stored in the address storage unit 210_0 will be taken as an example for illustrating the target refresh operation.

When the address of the word line WL111 is stored in the address storage unit 210_0, the word lines WL110 and WL112 may be refreshed at a predetermined cycle through a target refresh operation. The target refresh operation for the word lines WL110 and WL112 may be continued until the address stored in the address storage unit 210_0 is changed. However, preferably, the target refresh operation may be performed only once after the address is stored in the address storage unit 210_0. This is because, when the word lines WL110 and WL112 adjacent to the word line WL111 corresponding to the address stored in the address storage unit 210_0 are continuously refreshed, the data of the memory cells coupled to the word line WL111 corresponding to the address stored in the address storage unit 210_0 may be deteriorated.

More specifically, when the address of the word line WL111 is stored in the address storage unit 210_0, preferably only one target refresh operation may be performed on the word lines WL110 and WL112. This is because when the number of target refresh operations for the word lines WL110 and WL112 is increased (HIGH_ACT), the data of the memory cells coupled to the word line WL111 may be deteriorated due to the repeated active-precharge operations of the word lines WL110 and WL112. That is, the active counts of the word lines WL110 and WL112 to be refreshed through the target refresh operation may be increased to cause row hammer in the word line WL111.

Figure 4:
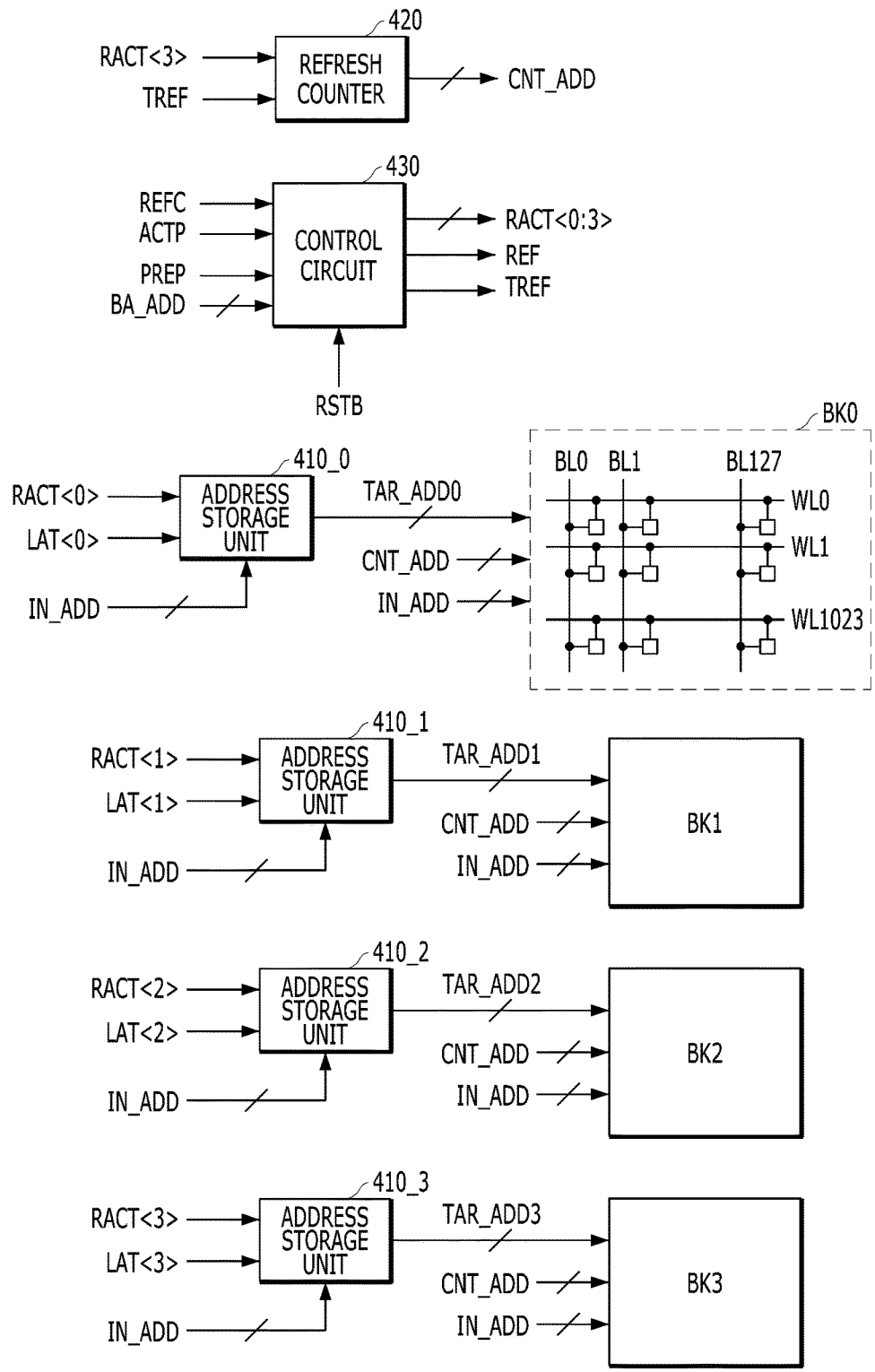
FIG. 4 is a configuration diagram of a memory device, according to an embodiment of the present invention.

FIG. 4 is a configuration diagram of a memory device, according to an embodiment of the present invention.

Referring to FIG. 4, the memory device may include a plurality of memory banks BK0 to BK3, a plurality of address storage units 410_0 to 410_3, a refresh counter 420, and a control circuit 430.

Each of the memory banks BK0 to BK3 may include a plurality of word lines WL0 to WL1023, a plurality of bit lines BL0 to BL127, and a plurality of memory cells MC coupled between the word lines WL0 to WL1023 and the bit lines BL0 to BL127. The number of word lines, bit lines, and memory cells may be changed depending on design. FIG. 4 does not illustrate the internal configurations of the memory banks BK1 to BK3, but simply illustrates the memory banks BK1 to BK3.

The control unit 430 via each of the address storage units 410_0 to 410_3 may activate a selected word line when a corresponding active control signal among a plurality of active control signals RACT<0:3> is activated, and precharge the selected word line when the corresponding active control signal is deactivated. The word line to be activated and or precharged may be selected by an input address IN_ADD during an active operation, selected by a counting address CNT_ADD during a normal refresh operation in which a refresh signal REF is activated and a target refresh signal TREF is deactivated, and selected by a corresponding target address among target addresses TAR_ADD0 to TAR_ADD3 during a target refresh operation in which both of the refresh signal REF and the target refresh signal TREF are activated. For example, the refresh signal REF may be activated during a refresh period of a normal refresh operation or of the target refresh operation. Also, for example, the target refresh signal TREF may be activated during a target refresh period in which the target refresh operation is performed.

Each of the address storage units 410_0 to 410_3 may correspond to each of the memory banks BK0 to BK3, respectively. Each of the address storage units 410_0 to 410_3 may store an address of a word line which is activated in the corresponding memory bank. The plurality of address storage units 410_0 to 410_3 may output the target address TAR_ADD0 to TAR_ADD3 at the target refresh period in which the refresh signal REF and the target refresh signal TREF are activated. When the address stored in the address storage units 410_0 to 410_3 is the address of a Kth word line, the target address TAR_ADD0 to TAR_ADD3 may correspond to the address of the (K−1)th or (K+1)th word line.

Each of the address storage units 410_0 to 410_3 may store the input address IN_ADD when the corresponding active control signal among the active control signals RACT<0:3> is activated and a corresponding latch signal among a plurality of latch signals LAT<0:3> is activated. For example, when the active control signal RACT<0> is activated and the latch signal LAT<0> is activated, the address storage unit 410_0 may store the input address IN_ADD. The latch signals LAT<0:3> may be activated at a predetermined cycle or at various conditions depending design, and activated one or more times between refresh commands adjacent to each other.

The refresh counter 420 may generate a counting address CNT_ADD. The refresh counter 420 may increase the value of the counting address CNT_ADD by one in response to the third refresh active signal RACT<3>. That is, the refresh counter 420 may change the value of the counting address CNT_ADD by performing counting whenever all of the memory banks BK0 to BK3 are refreshed once through the normal refresh operation. When the value of the counting address CNT_ADD is increased by one, it may indicate that the counting address CNT_ADD is changed to select the (K+1)th word line this time in case where the Kth word line was selected last time. However, when the target refresh signal TREF is activated, the refresh counter 420 may not count the counting address CNT_ADD even though the third refresh active signal RACT<3> is activated.

The control circuit 430 may control the plurality of memory banks BK0 to BK3 to be refreshed through the normal refresh operation in response to a refresh command REFC. At this time, a memory bank on which an active operation was performed between the current refresh command REFC and the previous refresh command REFC, among the plurality of memory banks BK0 to BK3, may be controlled to be refreshed through the target refresh operation, and the other memory banks may be controlled not to be refreshed through the target refresh operation. When a memory bank is controlled not to be refreshed through the target refresh operation, the memory bank does not perform the target refresh operation but skips the target refresh operation at the target refresh period on which the target refresh operation is performed.

The control circuit 430 may activate a memory bank corresponding to a bank address BA_ADD among the plurality of memory banks BK0 to BK3 in response to an active signal ACTP, and precharge the activated memory bank in response to a precharge signal PREP. The active signal ACTP may include a pulse signal which is activated when an active command is applied, and the precharge signal PREP may include a pulse signal which is activated when a precharge command is applied.

The control circuit 430 may control the memory banks BK0 to BK3 to be refreshed through at least one of the normal refresh operation and the target refresh operation, when the refresh command REFC is applied. At this time, only memory banks which have been activated between the current refresh command and the previous refresh command may be controlled to be refreshed through the target refresh operation, and memory banks which have never been activated between the current refresh command REFC and the previous refresh command REFC may be controlled not to be refreshed through the target refresh operation.

In a memory device in accordance with a first embodiment, the control circuit 430 may control a memory bank on which the target refresh operation is not to be performed, so that the memory bank does not perform neither the normal refresh operation nor the target refresh operation during the target refresh period. In a memory device in accordance with a second embodiment, the control circuit 430 may control a memory bank on which the target refresh operation is not to be performed, so that the memory bank performs only the normal refresh operation during the target refresh period.

Figure 5A:
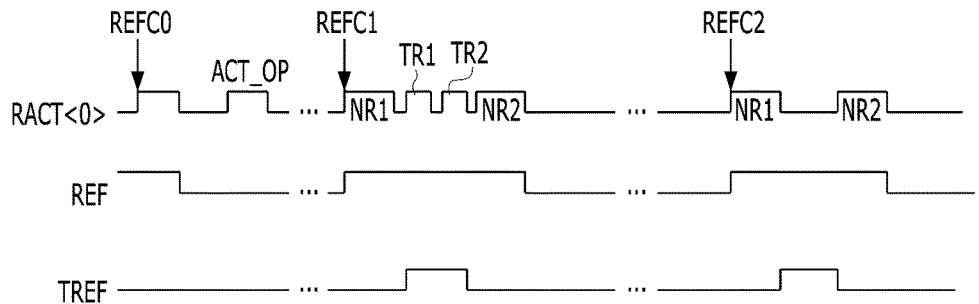
FIGS. 5A and 5B are diagrams illustrating operations of the memory device of FIG. 4, according to first and second embodiments of the present invention, respectively.
Figure 5B:
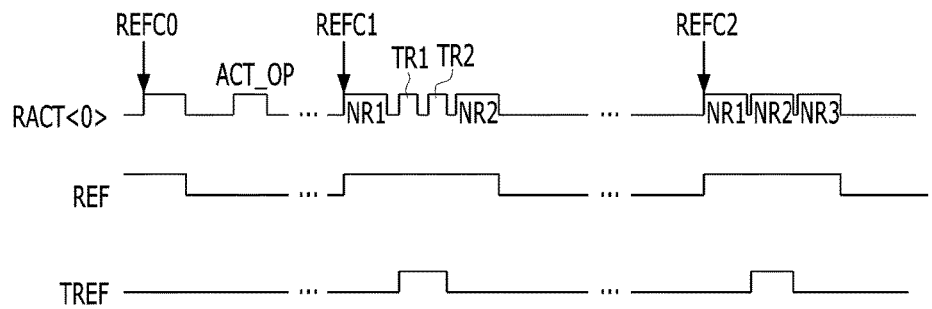

FIGS. 5A and 5B are diagrams illustrating operations of the memory device of FIG. 4, according to the first and second embodiments, respectively.

Referring to FIGS. 5A and 5B, the normal refresh operation or target refresh operation of the memory banks BK0 to BK3 may be performed at the refresh period in which the refresh command REFC is periodically applied and the refresh signal REF is activated in response to the refresh command REFC. For example, the normal refresh operation may be performed at a period in which the refresh signal REF is activated and the target refresh signal TREF is deactivated, and the target refresh operation may be performed at a period in which both of the refresh signal REF and the target refresh signal TREF are activated, i.e., the target refresh period. The active control signal RACT<0> may be activated during an active operation, a normal refresh operation, and a target refresh operation.

FIG. 5A is a diagram illustrating the operation of the memory device, according to the first embodiment.

FIG. 5A illustrates the case in which an active operation ACT_OP of the memory bank BK0 is performed between a refresh command REFC1 and the previous refresh command REFC0, and not between the refresh command REFC1 and the refresh command REFC2.

Since the active operation ACT_OP of the memory bank BK0 was performed between the refresh command REFC1 and the previous refresh command REFC0, normal refresh operations NR1 and NR2 and target refresh operations TR1 and TR2 may be performed in the memory bank BK0 in response to the refresh command REFC1. When the address stored in the address storage unit 410_0 corresponds to the word line WL111, the word line WL112 may be refreshed during the first target refresh TR1 and the word line WL110 may be refreshed during the second target refresh TR2, or vice versa.

Since the active operation ACT_OP of the memory bank BK0 was not performed between the refresh command REFC1 and the refresh command REFC2, only the normal refresh operations NR1 and NR2 may be performed in the memory bank BK0 in response to the refresh command REFC2, and not any target refresh operations.

FIG. 5B is a diagram illustrating the operation of the memory device, according to the second embodiment.

FIG. 5B illustrates the case in which an active operation ACT_OP of the memory bank BK0 is performed between the refresh command REFC1 and the previous refresh command REFC0, and not between the refresh command REFC1 and the refresh command REFC2.

The refresh operation performed in the memory bank BK0 in response to the refresh command REFC1 may be performed in the same manner as described with reference to FIG. 5A.

Since the active operation ACT_OP of the memory bank BK0 was not performed between the refresh command REFC1 and the refresh command REFC2, only normal refresh operations NR1, NR2, and NR3 may be performed in the memory bank BK0 in response to the refresh command REFC2, and not any target refresh operations. When a target refresh operation is not to be performed, the memory device according to the second embodiment may perform a normal refresh operation at the target refresh period. In this case, the overall word lines can be refreshed within a shorter time.

As described above with reference to FIG. 3, the memory device may store the address of a specific word line during an active operation, and refresh word lines adjacent to the specific word line through a target refresh operation in response to a refresh command. In this case, when the target refresh operation is repeated more than once, the data of the specific word line may be deteriorated due to row hammer. Hence, preferably, the target refresh operation is performed only once for each of the adjacent word lines of the specific word line.

The address storage unit may store an address during an active operation. Thus, when an active operation is not to be performed between a specific refresh command and the previous refresh command, no address may be stored in the address storage unit or the address stored in the address storage unit may be an address stored before the previous refresh command is applied. In the latter case, however, a target refresh operation may be performed in response to the previous refresh command. Thus, when an active operation is not to be performed between the specific refresh command and the previous refresh command, the target refresh operation does not need to be performed using the address stored in the address storage unit.

When an active operation is not to be performed between the specific refresh command and the previous refresh command, the memory device of FIG. 4 may not perform a target refresh operation in response to the specific refresh command. Thus, the memory device may not perform two or more target refresh operations using the address stored in the address storage unit, which makes it possible to prevent row hammer which occurs due to the target refresh operations.

Figure 6:
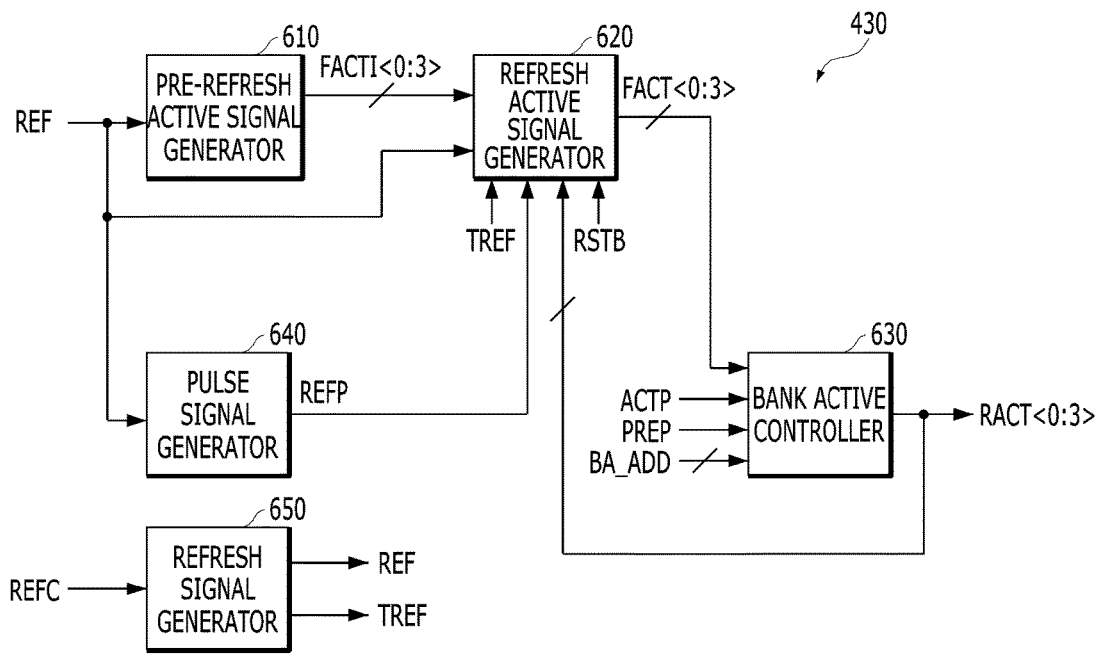
FIG. 6 is a configuration diagram of a control circuit of FIG. 4.

FIG. 6 is a configuration diagram of the control circuit 430 of FIG. 4.

Referring to FIG. 6, the control circuit 430 may include a pre-refresh active signal generator 610, a refresh active signal generator 620, a bank active controller 630, a pulse signal generator 640 and a refresh signal generator 650.

The pre-refresh active signal generator 610 may activate a plurality of pre-refresh active signals FACTI<0:3>, each of which corresponds to one of the memory banks BK0 to BK3, one or more times during the refresh period. The pre-refresh active signal generator 610 may sequentially activate each of the pre-refresh active signals FACTI<0:3> one or more times during the refresh period.

Figure 7:
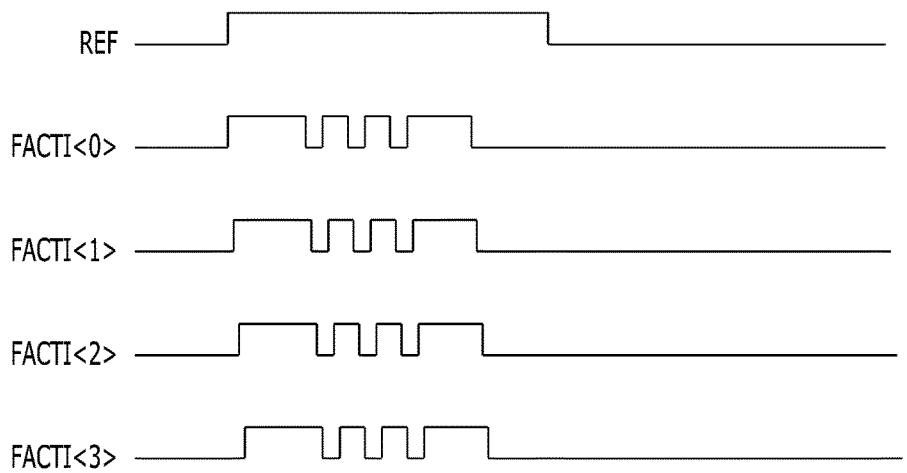
FIG. 7 is a waveform diagram illustrating an operation of a pre-refresh active signal generator of FIG. 6.

FIG. 7 is a waveform diagram illustrating an operation of the pre-refresh active signal generator 610.

Referring to FIG. 7, the pre-refresh active signal generator 610 may sequentially activate the pre-refresh active signals FACTI<0:3> four times during the refresh period.

Hereinafter, the operation of the control circuit 430 will be described based on the pre-refresh active signals FACTI<0>.

In the control circuit 430 according to the first embodiment, the refresh active signal generator 620 may transmit the plurality of pre-refresh active signals FACTI<0:3> as a plurality of refresh active signals FACT<0:3>, respectively, but may block a pre-refresh active signal of which the corresponding active control signal is not activated between the current refresh command and the previous refresh command, during the target refresh period.

Figure 8:
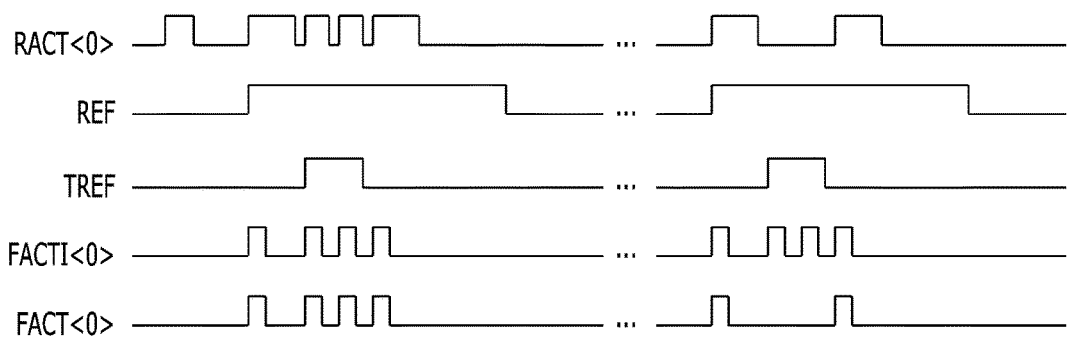
FIG. 8 is a diagram illustrating an operation of a refresh active signal generator of FIG. 6, according to the first embodiment.

FIG. 8 is a diagram illustrating an operation of the refresh active signal generator 620 of FIG. 6, according to the first embodiment.

Referring to FIG. 8, when the active control signal RACT<0> is activated in a state where the refresh signal REF is deactivated, the pre-refresh active signal FACTI<0> may be transmitted as the refresh active signal FACT<0> during the refresh period in which the refresh signal REF is activated. On the other hand, when the active control signal RACT<0> has never been activated in a state where the refresh signal REF is deactivated, the pre-refresh active signal FACTI<0> may be blocked during the target refresh period in which the refresh signal REF and the target refresh signal TREF are activated.

The bank active controller 630 may generate the plurality of active control signals RACT<0:3>, each corresponding to an active operation of one of the plurality of memory banks BK0 to BK3, and activate an active control signal corresponding to the activated refresh active signal, among the plurality of active control signals RACT<0:3>. Furthermore, the bank active controller 630 may activate an active control signal corresponding to the bank address BA_ADD when the active signal ACTP is activated, and deactivate the activated active control signal when the precharge signal PREP is activated.

For example, the bank active controller 630 may activate the active control signal RACT<0> during a predetermined period when the refresh active signal FACT<0> is activated, activate the active control signal RACT<0> corresponding to the bank address BA_ADD when the active signal ACTP is activated, and deactivate the activated active control signal RACT<0> when the precharge signal PREP is activated.

The pulse signal generator 640 may generate a refresh end pulse REFP which is activated during a predetermined period, when the refresh signal REF is deactivated. Thus, the refresh end pulse REFP may be activated at the point of time that the refresh period is ended.

The refresh signal generator 650 may enable the refresh signal REF which is activated during a predetermined period, when the refresh command REFC is applied. The refresh signal generator 650 may enable the refresh signal which TREF is activated during a predetermined period, when the refresh command REFC is applied a predetermined number of times.

Figure 9:
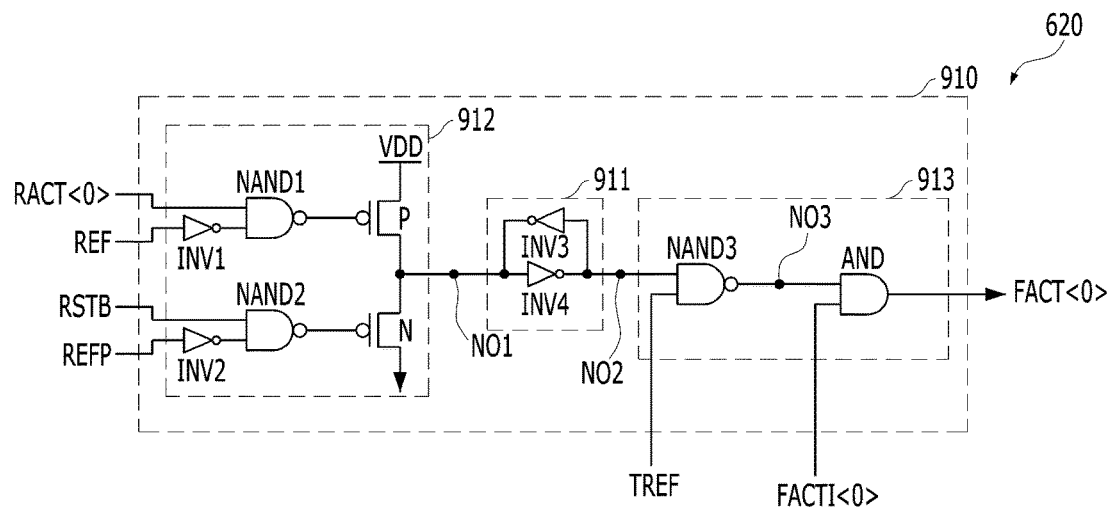
FIG. 9 is a configuration diagram of the refresh active signal generator of FIG. 6, according to the first embodiment.
Figure 9:
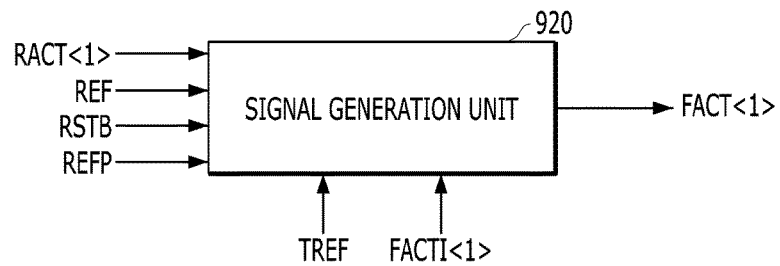
Figure 9:
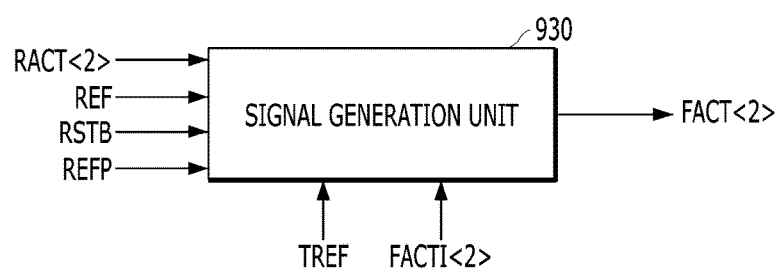
Figure 9:
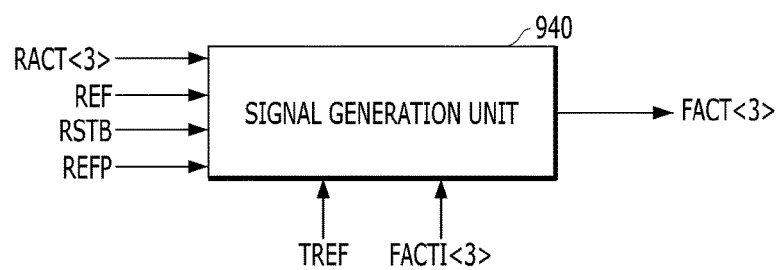

FIG. 9 is a configuration diagram of the refresh active signal generator 620 of FIG. 6, according to the first embodiment.

Referring to FIG. 9, the refresh active signal generator 620 may include a plurality of signal generation units 910 to 940. Each of the signal generation units 910 to 940 may include an internal node NO1, a latch 911, a driving unit 912, and a signal transmission unit 913. In FIG. 9, only the internal configuration of the signal generation unit 910 is illustrated, and the other signal generation units 910 to 940 may be configured and operated in the same manner.

The driving unit 912 may drive a voltage of the internal node NO1 to a first level, for example to a high level, when the corresponding active control signal RACT<0> is activated at periods other than the refresh period. The driving unit 912 may drive the voltage of the internal node NO1 to a second level (for example, low level) when the refresh period is ended. The driving unit 912 may include transistors N and P, inverters INV1 and INV2, and NAND gates NAND1 and NAND2.

The driving unit 912 may drive the internal node NO1 in response to the active control signal RACT<0>, the refresh signal REF, a reset signal RSTB, and the refresh end pulse REFP. When the active control signal RACT<0> is activated, for example to a high level, in a state where the refresh signal REF is deactivated, for example to a low level, the driving unit 912 may drive the internal node NO1 to a high level since the transistor P is turned on. Furthermore, when the reset signal RSTB is activated, for example to a low level, or the refresh end pulse PREF is activated, for example to a high level, the driving unit 912 may drive the internal node NO1 to a low level since the transistor N is turned on.

When the internal node NO1 is driven to a high level, the node NO2 may be driven to a low level. The latch 911 coupled between the internal node NO1 and the node NO2 may retain the voltage of the internal node NO1 to a constant level when the internal node NO1 is not driven by the driving unit 912. The latch 911 may include inverters INV3 and INV4.

The signal transmission unit 913 may transmit the pre-refresh active signal FACTI<0> as the refresh active signal FACT<0> during a normal refresh operation. Furthermore, the signal transmission unit 913 may transmit the pre-refresh active signal FACTI<0> as the refresh active signal FACT<0> when the voltage of the internal node NO1 is at a high level during the target refresh operation, and block the pre-refresh active signal FACTI<0> so as not to transmit the pre-refresh active signal FACTI<0> as the refresh active signal FACT<0> when the voltage of the internal node NO1 is at a low level during the target refresh operation. The signal transmission unit 913 may include a NAND gate NAND3 and an AND gate AND.

Since an output NO3 of the NAND gate NAND3 becomes a high level when the target refresh signal TREF is deactivated (for example, low level), the pre-refresh active signal FACTI<0> may be transmitted as the refresh active signal FACT<0>. Since the output NO3 of the NAND gate NAND3 becomes a high level when the target refresh signal TREF is activated and the voltage of the node NO2 is at a low level, the pre-refresh active signal FACTI<0> may be transmitted as the refresh active signal FACT<0>. Since the output NO3 of the NAND gate NAND3 becomes a low level when the target refresh signal TREF is activated and the voltage of the node NO2 is at a high level, the pre-refresh active signal FACTI<0> may be blocked, and the refresh active signal FACT<0> may not be activated.

The refresh control circuit according to the embodiment of the present invention may include the pre-refresh active signal generator 610, the refresh active signal generator 620, and the pulse signal generator 640, which are described above.

In accordance with the embodiments of the present invention, the memory device may perform a target refresh operation to prevent the deterioration of data stored in a memory cell, which may occur due to row hammer.

Furthermore, the memory device may also prevent the deterioration of data stored in a memory cell, which may occur due to a target refresh operation.

Although various embodiments have been described for illustrative purposes, it will be apparent to those skilled in the art that various changes and modifications may be made without departing from the spirit and or scope of the invention as defined in the following claims.

For example, it is noted that the positions and the types of the logic gates and the transistors in the aforementioned embodiments may be differently realized according to the polarities of inputted signals.

What is claimed is:

1. A memory device comprising:
   a plurality of memory banks; and
   a plurality of address storage units configured to store an address corresponding to a word line of a corresponding memory bank among the plurality of memory banks; and
   a control circuit configured to refresh the plurality of memory banks through a first refresh operation in response to a refresh command, and refresh a certain memory bank, which is not refreshed through a second refresh operation after the address is stored in a corresponding address storage unit among the plurality of address storage units,
   wherein the control circuit comprises:
      a pre-refresh active signal generator configured to activate a plurality of pre-refresh active signals, each corresponding to one of the memory banks, one or more times during a refresh period in which the first refresh operation or the second refresh operation is performed; and
      a refresh active signal generator configured to transmit the plurality of pre-refresh active signals as a plurality of refresh active signals, respectively, and block a pre-refresh active signal of which a corresponding active control signal is not activated between a current refresh command and a previous refresh command, during the second refresh period.

2. The memory device of claim 1, wherein the control circuit controls the memory banks except for the certain memory bank, to skip the second refresh operation.

3. The memory device of claim 2, wherein the first refresh operation comprises a normal refresh operation for sequentially refreshing a plurality of word lines of the plurality of memory banks, and
   the second refresh operation comprises a target refresh operation for refreshing a word line adjacent to a word line corresponding to the address stored in a corresponding address storage unit.

4. The memory device of claim 2, wherein each of the address storage units stores an address of a word line which is activated at a given time point, among a plurality of word lines of the corresponding memory bank among the plurality of memory banks.

5. The memory device of claim 2, wherein the control circuit additionally performs the first refresh operation on the memory bank which is controlled to skip the second refresh operation among the plurality of memory banks.

6. The memory device of claim 2, further comprising:
   a refresh counter configured to generate a refresh address for selecting a word line to be refreshed through the first refresh operation in the plurality of memory banks.

7. The memory device of claim 1, wherein the control circuit further comprises:
   a bank active controller configured to generate a plurality of active control signals, each corresponding to an active operation of one of the plurality of memory banks, and activate an active control signal corresponding to a bank address in response to an active command or activate an active control signal corresponding to an activated refresh active signal, among the plurality of active control signals.

8. The memory device of claim 1, wherein the refresh active signal generator comprises a plurality of signal generation units, and
   each of the signal generation units comprises:
   a latch configured to latch a voltage of an internal node; and
   a driving unit configured to drive the voltage of the internal node to a first level when the corresponding active control signal is activated at periods except for the refresh period, and drive the voltage of the internal node to a second level when the refresh period is ended.

9. The memory device of claim 8, wherein each of the signal generation units further comprises:
   a signal transmission unit configured to transmit the corresponding pre-refresh active signal as the corresponding refresh active signal during the first refresh operation, transmit the corresponding pre-refresh active signal as the corresponding refresh active signal when the voltage of the internal node is at the first level during the second refresh operation, and block the corresponding pre-refresh active signal when the voltage of the internal node is at the second level during the second refresh operation.

* * * * *